(12) United States Patent
Xue et al.

(10) Patent No.: US 8,329,518 B1
(45) Date of Patent: Dec. 11, 2012

(54) METHODS FOR MANUFACTURING THIN FILM TRANSISTOR ARRAY SUBSTRATE AND DISPLAY PANEL

(75) Inventors: Jing-feng Xue, Shenzhen (CN); Jehao Hsu, Shenzhen (CN); Xiaohui Yao, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/376,636

(22) PCT Filed: Oct. 11, 2011

(86) PCT No.: PCT/CN2011/080644
§ 371 (c)(1),
(2), (4) Date: Dec. 7, 2011

(30) Foreign Application Priority Data

Aug. 11, 2011  (CN) .......................... 2011 1 0229711

(51) Int. Cl.
*H01L 21/00* (2006.01)
*H01L 21/84* (2006.01)
*H01L 21/8238* (2006.01)
*H01L 21/469* (2006.01)

(52) U.S. Cl. .......... 438/149; 438/30; 438/155; 438/778; 438/789; 438/158; 438/201; 257/E29.151

(58) Field of Classification Search .......................... None
See application file for complete search history.

(56) References Cited

U.S. PATENT DOCUMENTS

| | | | |
|---|---|---|---|
| 6,337,284 B1 * | 1/2002 | Hwang et al. | 438/710 |
| 7,205,571 B2 * | 4/2007 | Ahn et al. | 257/72 |
| 7,507,593 B2 * | 3/2009 | Oh et al. | 438/30 |
| 7,745,342 B2 * | 6/2010 | Kim et al. | 438/720 |
| 7,760,317 B2 * | 7/2010 | Lim et al. | 349/152 |
| 7,803,673 B2 * | 9/2010 | Lee et al. | 438/158 |
| 2011/0272696 A1 * | 11/2011 | Ryu et al. | 257/59 |

* cited by examiner

*Primary Examiner* — Seahvosh Nikmanesh
*Assistant Examiner* — Evren Seven

(57) ABSTRACT

The present invention provides methods for manufacturing a thin film transistor (TFT) array substrate and a display panel. The method for manufacturing the TFT array substrate comprises the following steps: forming a plurality of gate electrodes, a gate insulating layer, a semiconductor layer, an ohmic contact layer, an electrode layer and a first photo-resist layer on a transparent substrate in sequence; patterning the first photo-resist layer; etching the ohmic contact layer and the electrode layer; coating a second photo-resist layer on the patterned first photo-resist layer and in the channels; removing the second photo-resist layer on the patterned first photo-resist layer and to allow the second photo-resist layer in the channels to remain therein; etching the semiconductor layer; removing the patterned first photo-resist layer and the second photo-resist layer; forming a passivation layer on the channels, the source electrodes and the drain electrodes; and forming a pixel electrode layer on the passivation layer. The present invention can reduce an amount of the required masks in the fabrication process, and only one wet etching is required to etch the metal material on the TFT array substrate.

15 Claims, 5 Drawing Sheets

METHODS FOR MANUFACTURING THIN FILM TRANSISTOR ARRAY SUBSTRATE AND DISPLAY PANEL

FIELD OF THE INVENTION

The present invention relates to a field of a liquid crystal display technology, and more particularly to methods for manufacturing a thin film transistor (TFT) array substrate and a display panel.

BACKGROUND OF THE INVENTION

Liquid crystal displays (LCDs) have been widely applied in electrical products. Currently, most of LCDs are backlight type LCDs which comprise a liquid crystal panel and a backlight module. In general, the LCD panel may include a color filter (CF) substrate and a TFT array substrate. The CF substrate includes a plurality of color filters and a common electrode. The TFT array substrate includes a plurality of parallel scanning lines, a plurality of parallel data lines, a plurality of TFTs and a plurality of pixel electrodes. The scanning lines are respectively vertical to the data lines. Each adjacent two of the scanning lines and each adjacent two of the data lines intersect to define a pixel area.

In a process for fabricating the TFT array substrate, a plurality of masks are required to perform photolithography processes. However, the masks are very expensive. For this reason, the more an amount of the masks is, the higher a cost for fabricating the TFT is. Furthermore, more masks will result in longer process time and more complicated process. Besides, in the photolithography process, several steps of wet etching are required, hence deteriorating metal lines of the TFT array substrate As a result, it is necessary to provide methods for manufacturing a TFT array substrate and a display panel to solve the problems existing in the conventional technologies, as described above.

SUMMARY OF THE INVENTION

The present invention provides methods for manufacturing a thin film transistor array substrate and a display panel, so as to solve the problems existing in the TFT manufacturing process.

A primary object of the present invention is to provide a method for manufacturing a thin film transistor array substrate, and the method comprising the following steps: forming a plurality of gate electrodes on a transparent substrate; forming a gate insulating layer, a semiconductor layer, an ohmic contact layer, an electrode layer and a first photo-resist layer on the transparent substrate and the gate electrodes in sequence; patterning the first photo-resist layer to form channels, wherein the channels are formed above the gate electrodes; etching the ohmic contact layer and the electrode layer, so as to remove a portion of the ohmic contact layer and a portion of the electrode layer, and to form a plurality of source electrodes and a plurality of drain electrodes at both sides of the channels, respectively; coating a second photo-resist layer on the patterned first photo-resist layer and in the channels, wherein, after coating the second photo-resist layer, a thickness of the second photo-resist layer in the channels is larger than another thickness of the second photo-resist layer on the patterned first photo-resist layer; using an ashing process to remove the second photo-resist layer on the patterned first photo-resist layer and to allow the second photo-resist layer in the channels to remain therein; etching the semiconductor layer to remove a portion of the semiconductor layer; removing the patterned first photo-resist layer and the second photo-resist layer; forming a passivation layer on the channels, the source electrodes and the drain electrodes; and forming a pixel electrode layer on the passivation layer, wherein the pixel electrode layer is electrically connected to the drain electrodes.

Another object of the present invention is to provide a method for manufacturing a thin film transistor array substrate, and the method comprises the following steps: forming a plurality of gate electrodes on a transparent substrate; forming a plurality of gate electrodes on a transparent substrate; forming a gate insulating layer, a semiconductor layer, an ohmic contact layer, an electrode layer and a first photo-resist layer on the transparent substrate and the gate electrodes in sequence; patterning the first photo-resist layer to form channels, wherein the channels are formed above the gate electrodes; etching the ohmic contact layer and the electrode layer, so as to remove a portion of the ohmic contact layer and a portion of the electrode layer, and to form a plurality of source electrodes and a plurality of drain electrodes at both sides of the channels, respectively; coating a second photo-resist layer on the patterned first photo-resist layer and in the channels; removing the second photo-resist layer on the patterned first photo-resist layer and to allowing the second photo-resist layer in the channels to remain therein; etching the semiconductor layer to remove a portion of the semiconductor layer; removing the patterned first photo-resist layer and the second photo-resist layer; forming a passivation layer on the channels, the source electrodes and the drain electrodes; and forming a pixel electrode layer on the passivation layer, wherein the pixel electrode layer is electrically connected to the drain electrodes.

Still another object of the present invention is to provide a method for manufacturing a display panel, and the method comprises the following steps: forming a plurality of gate electrodes on a transparent substrate; forming a gate insulating layer, a semiconductor layer, an ohmic contact layer, an electrode layer and a first photo-resist layer on the transparent substrate and the gate electrodes in sequence; patterning the first photo-resist layer to form channels, wherein the channels are formed above the gate electrodes; etching the ohmic contact layer and the electrode layer, so as to remove a portion of the ohmic contact layer and a portion of the electrode layer, and to form a plurality of source electrodes and a plurality of drain electrodes at both sides of the channels, respectively; coating a second photo-resist layer on the patterned first photo-resist layer and in the channels; removing the second photo-resist layer on the patterned first photo-resist layer and to allowing the second photo-resist layer in the channels to remain therein; etching the semiconductor layer to remove a portion of the semiconductor layer; removing the patterned first photo-resist layer and the second photo-resist layer; forming a passivation layer on the channels, the source electrodes and the drain electrodes; forming a pixel electrode layer on the passivation layer, wherein the pixel electrode layer is electrically connected to the drain electrodes, so as to achieve a thin film transistor array substrate; and forming a liquid crystal layer between the thin film transistor array substrate and a color filter substrate.

In one embodiment of the present invention, when etching the ohmic contact layer and the electrode layer, a wet etching is performed to remove portions of the ohmic contact layer and the electrode layer which are not sheltered by the patterned first photo-resist layer.

In one embodiment of the present invention, when coating the second photo-resist layer, the second photo-resist layer is coated by spin coating, blade coating or roller coating.

In one embodiment of the present invention, after coating the second photo-resist layer, a thickness of the second photo-resist layer in the channels is larger than another thickness of the second photo-resist layer on the patterned first photo-resist layer.

In one embodiment of the present invention, when removing the second photo-resist layer on the patterned first photo-resist layer, an ashing process is used to remove the second photo-resist layer.

In one embodiment of the present invention, when etching the semiconductor layer, the patterned first photo-resist layer and the second photo-resist layer in the channels are used to act as a mask, and a dry etching is performed to etch the semiconductor layer.

In one embodiment of the present invention, when removing the patterned first photo-resist layer and the second photo-resist layer, the patterned first photo-resist layer and the second photo-resist layer are removed by lifting off.

The methods of the present invention for manufacturing the TFT array substrate and the display panel can reduce an amount of the required masks in the fabrication process, hence reducing the cost and time of the fabrication process. The method of the present invention can reduce the using of wet etching, thereby alleviating the effect of the wet etching on the elements of the TFT array substrate. Moreover, the method of the present can use a normal mask for manufacturing without using a multi tone mask, thereby greatly reducing the process cost.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
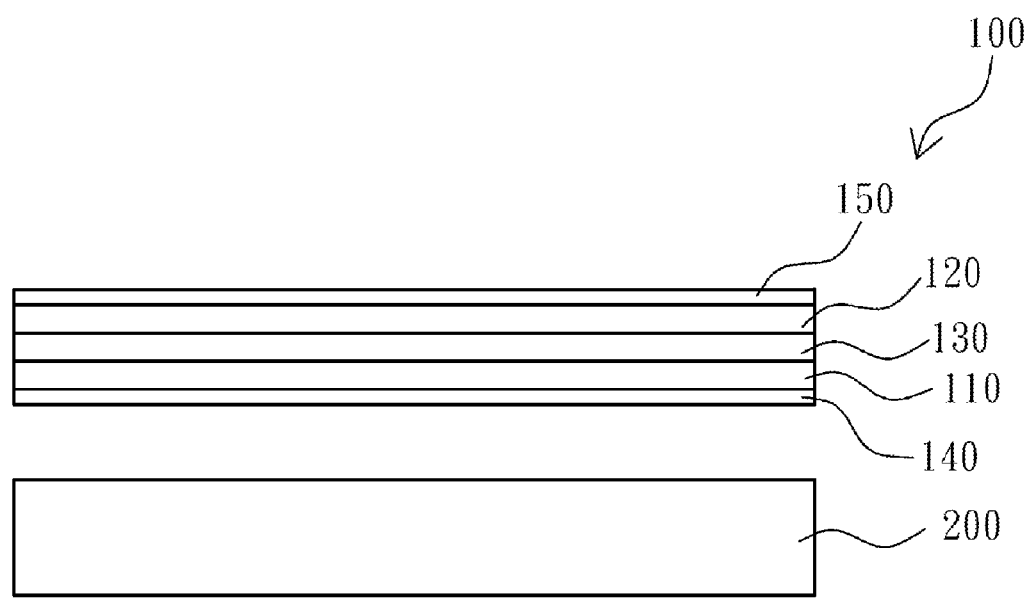
FIG. 1 is a cross-sectional view showing a display panel and a backlight module according to an embodiment of the present invention.
Figure 2A:
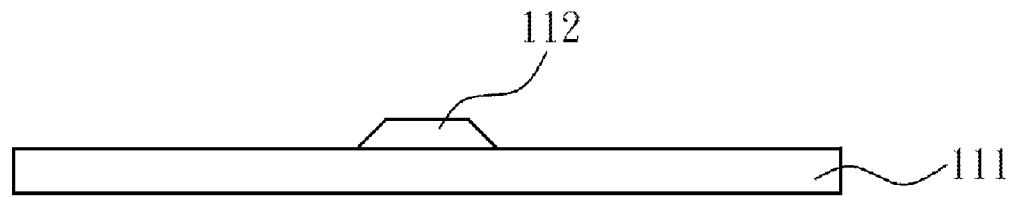
FIG. 2A through FIG. 2I are schematic flow diagrams showing a process for manufacturing a TFT array substrate according to an embodiment of the present invention.
Figure 2B:
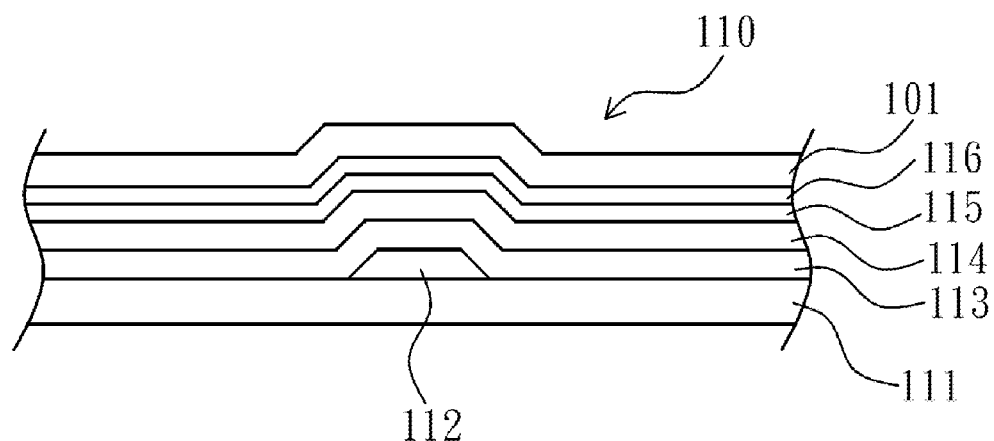
Figure 2C:
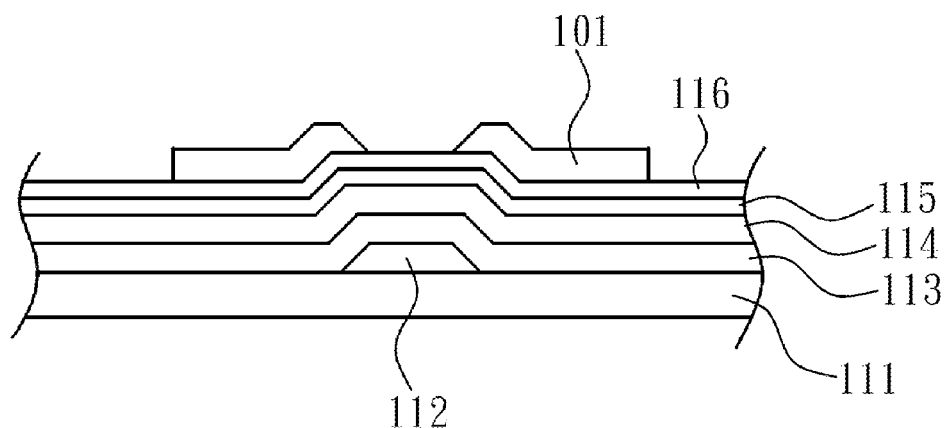
Figure 2D:
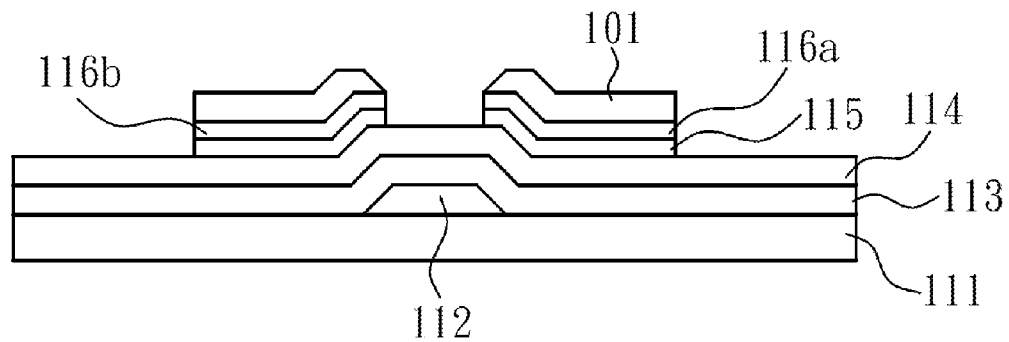
Figure 2E:
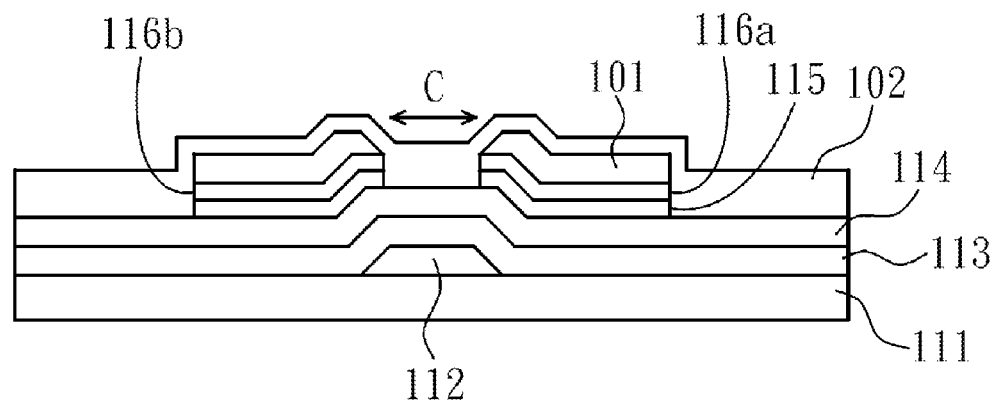
Figure 2F:
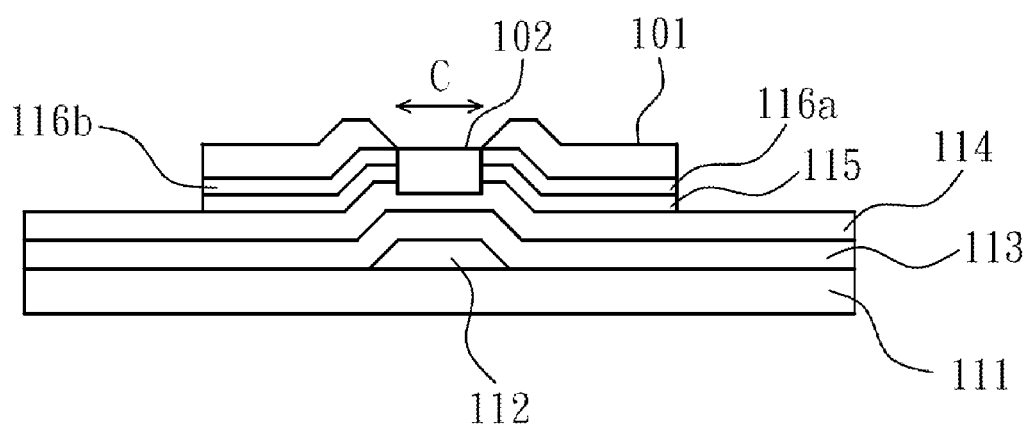
Figure 2G:
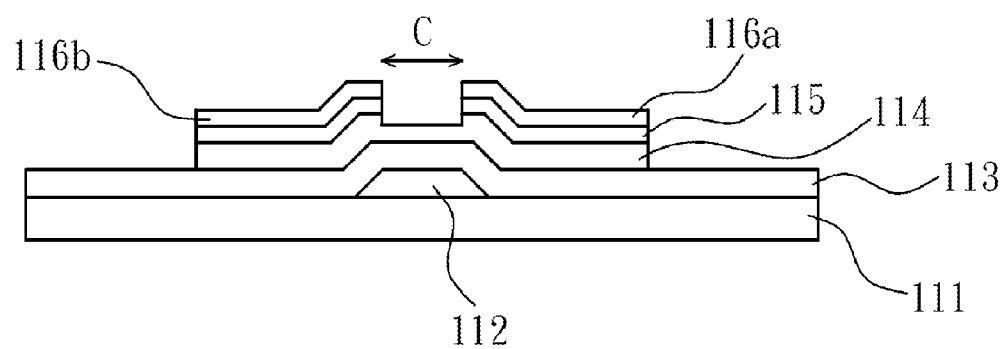
Figure 2H:
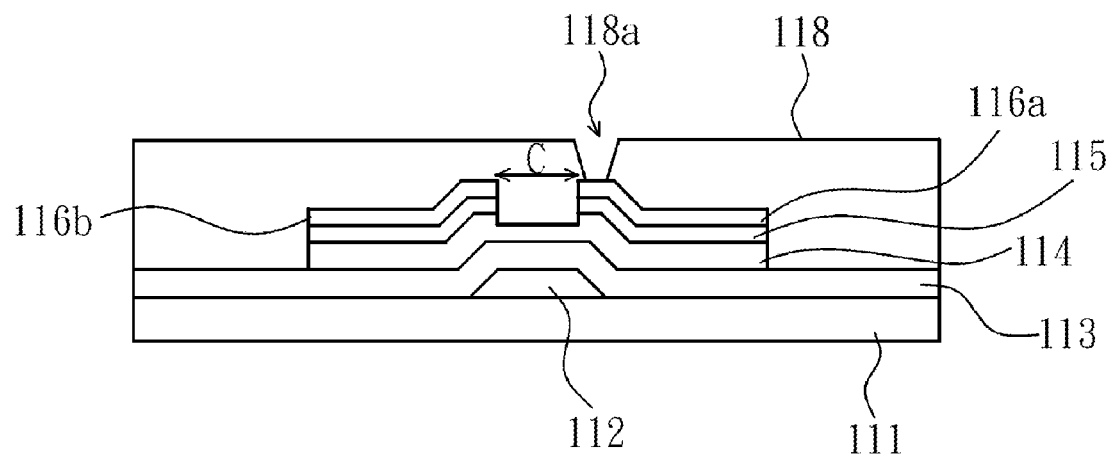
Figure 2I:
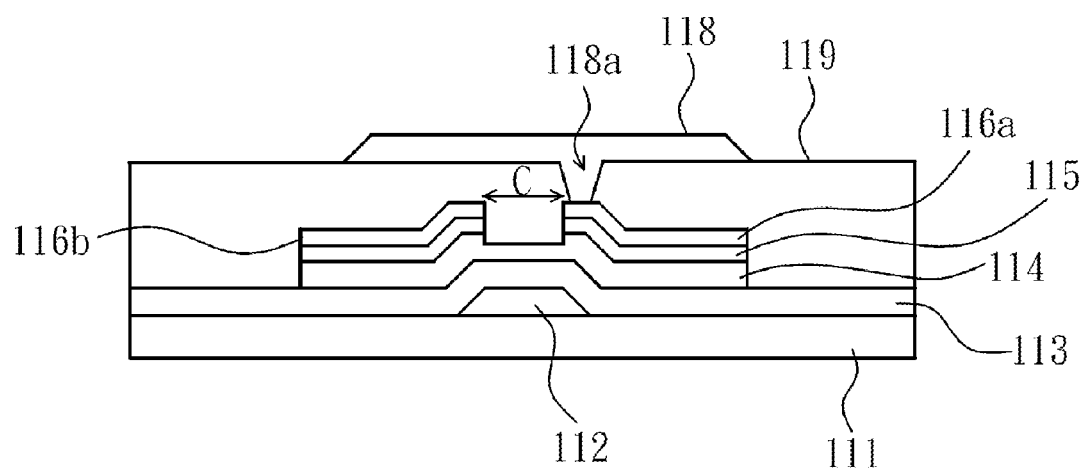

The following embodiments are referring to the accompanying drawings for exemplifying specific performable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

In the drawings, structure-like elements are labeled with like reference numerals.

Referring to FIG. 1, a cross-sectional view showing a display panel and a backlight module according to an embodiment of the present invention is illustrated. The method of the present embodiment for manufacturing a TFT array substrate can be applicable to the fabrication of the display panel 100, such as a liquid crystal display panel. When utilizing the display panel 100 of the present embodiment to fabricate a display apparatus, the display panel 100 may be disposed on the backlight module 200, thereby forming a liquid crystal display apparatus. The display panel 100 may comprise a first substrate 110, a second substrate 120, a liquid crystal layer 130, a first polarizer 140 and a second polarizer 150. The first substrate 110 and the second substrate 120 may be realized as glass substrates or flexible plastic substrates. In this embodiment, the first substrate 110 may be, for example, a TFT array substrate, and the second substrate 120 may be, for example, a color filter (CF) substrate. It notes that the CF and the TFT array may also be disposed on the same substrate in other embodiments.

Referring to FIG. 1 again, the liquid crystal layer 130 is formed between the first substrate 110 and the second substrate 120. The first polarizer 140 is disposed on one side of the first substrate 110 and opposite to the liquid crystal layer 130 (as a light-incident side). The second polarizer 150 is disposed on one side of the second substrate 120 and opposite to the liquid crystal layer 130 (as a light-emitting side).

Referring to FIG. 2A through FIG. 2I, schematic flow diagrams showing a process for manufacturing a TFT array substrate according to an embodiment of the present invention are illustrated. When manufacturing the TFT array substrate (such as the first substrate 110) of the present embodiment, referring to FIG. 2A, firstly, a plurality of gate electrodes 112 are formed on a transparent substrate 111. The transparent substrate 111 may be a quartz or glass substrate. The gate electrodes 112 can be formed by a photolithography process (a first mask process). The material of the gate electrodes 112 may be Al, Ag, Cu, Mo, Cr, W, Ta, Ti, metal nitride or any alloys thereof. Furthermore, the metallic layer of the gate electrodes 112 may be a multi-layer structure with heat-resistant film and lower resistance film, such as dual-layer structure with molybdenum nitride film and Al film.

Subsequently, referring to FIG. 2B again, a gate insulating layer 113, a semiconductor layer 114, an ohmic contact layer 115, an electrode layer 116 and a first photo-resist layer 101 are formed on the transparent substrate 111 and the gate electrodes 112 in sequence. The material of the gate insulating layer 113 may be silicon nitride ($SiN_x$) or silicon oxide ($SiO_x$) which may be formed with a plasma enhanced chemical vapor deposition (PECVD) method. The semiconductor layer 114 is preferably made of amorphous silicon (a-Si) or polycrystalline silicon. In this embodiment, for forming the semiconductor layer 114, an a-Si layer can be first deposited, and then a rapid thermal annealing step is performed to the a-Si layer, thereby allowing the a-Si layer to recrystallize into a polycrystalline silicon layer. The material of the ohmic contact layer 115 is preferably made of N+a-Si (or silicide) heavily doped with N dopant (such as phosphorous) using such as ion implantation or chemical vapor deposition method. The material of the electrode layer 116 may be Mo, Cr, Ta, Ti or alloys thereof.

Subsequently, referring to FIG. 2C again, the first photo-resist layer 101 is patterned (a second mask process) to form channels C on the first photo-resist layer 101. At this time, the channels C are formed above the gate electrodes 112 to expose a surface of the electrode layer 116. In this embodiment, a normal mask can be used to etch the first photo-resist layer 101 for patterning the first photo-resist layer 101.

Subsequently, referring to FIG. 2D again, the ohmic contact layer 115 and the electrode layer 116 are etched, so as to remove a portion of the ohmic contact layer 115 and a portion of the electrode layer 116, and to form a plurality of drain electrodes 116a and a plurality of source electrodes 116b at both sides of the channels C, respectively. At this time, the patterned first photo-resist layer 101 can be used to act as a mask, a wet etching is performed to etch the ohmic contact layer 115 and the electrode layer 116, so as to remove the portions (especially the portions positioned in the channels C) of the ohmic contact layer 115 and the electrode layer 116 which are not sheltered by the patterned first photo-resist layer 101.

Subsequently, referring to FIG. 2E again, a second photo-resist layer 102 is coated on the patterned first photo-resist layer 101 and in the channels C. In this case, the second photo-resist layer 102 can be coated by spin coating, blade coating or roller coating. When coating the second photo-resist layer 102, since the channels C are concave, the recessions of the channels C are filled with the second photo-resist layer 102, and a thickness of the second photo-resist layer 102 in the channels C is larger than another thickness of the second photo-resist layer 102 on the patterned first photo-resist layer 101.

Subsequently, referring to FIG. 2F again, removing the second photo-resist layer 102 on the patterned first photo-resist layer 101 and allowing the second photo-resist layer 102 in the channels C to remain therein. In this embodiment, a high temperature ashing process is used to process the photo-resist layer 102 for removing the second photo-resist layer 102 on the patterned first photo-resist layer 101. At this time, since the thickness of the second photo-resist layer 102 in the channels C is larger than the thickness of the second photo-resist layer 102 on the patterned first photo-resist layer 101, the second photo-resist layer 102 in the channels C can be allowed to remain therein for sheltering the channels C.

Subsequently, referring to FIG. 2F again, the semiconductor layer 114 is etched to remove a portion of the semiconductor layer 114. At this time, the patterned first photo-resist layer 101 and the second photo-resist layer 102 in the channels C can be used to act as a mask, and another dry etching is performed to remove the portion of the semiconductor layer 114 which is not sheltered by the patterned first photo-resist layer 101 and the second photo-resist layer 102, thereby patterning the semiconductor layer 114. In this case, the patterned semiconductor layer 114 can be acted as semiconductor islands of the TFTs. Subsequently, referring to FIG. 2G again, the patterned first photo-resist layer 101 and the second photo-resist layer 102 may be removed by lifting off.

Subsequently, referring to FIG. 2H again, a passivation layer 118 is formed on the channels C, the drain electrodes 116a and the source electrodes 116b (a third mask process), wherein the passivation layer 118 includes at least one contact hole 118a to expose a portion of the drain electrodes 116a. In this case, the passivation layer 118 can be formed by a PECVD apparatus.

Subsequently, referring to FIG. 2I again, a transparent and electrically conductive layer (such as ITO, IZO, AZO, GZO, TCO or ZnO) is first formed on the passivation layer 118, and then the transparent and electrically conductive layer is patterned to form a pixel electrode layer 119 with using photolithography (a fourth mask process). The pixel electrode layer 119 covers the contact hole 118a of the passivation layer 118, and thus the electrode layer 119 can be electrically connected to the drain electrodes 116a through the contact hole 118a, thereby forming the TFT array substrate 110 of the present embodiment.

As described above, the methods of the present invention for manufacturing the TFT array substrate and the display panel can use only four masks to manufacture the TFT array substrate for reducing an amount of the required masks in the fabrication process, hence reducing the cost and time of the fabrication process. Furthermore, in the second mask process, only one wet etching is required, hence alleviating the effect of the wet etching on the elements of the TFT array substrate. In addition, the method can use a normal mask for manufacturing without using a multi tone mask, thereby greatly reducing the process cost.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A method for manufacturing a thin film transistor array substrate, comprising the following steps:

forming a plurality of gate electrodes on a transparent substrate;

forming a gate insulating layer, a semiconductor layer, an ohmic contact layer, an electrode layer and a first photo-resist layer on the transparent substrate and the gate electrodes in sequence;

patterning the first photo-resist layer to form channels, wherein the channels are formed above the gate electrodes;

etching the ohmic contact layer and the electrode layer, so as to remove a portion of the ohmic contact layer and a portion of the electrode layer, and to form a plurality of source electrodes and a plurality of drain electrodes at both sides of the channels, respectively;

coating a second photo-resist layer on the patterned first photo-resist layer and in the channels, wherein, after coating the second photo-resist layer, a thickness of the second photo-resist layer in the channels is larger than another thickness of the second photo-resist layer on the patterned first photo-resist layer;

using an ashing process to remove the second photo-resist layer on the patterned first photo-resist layer and to allow the second photo-resist layer in the channels to remain therein;

etching the semiconductor layer to remove a portion of the semiconductor layer;

removing the patterned first photo-resist layer and the second photo-resist layer;

forming a passivation layer on the channels, the source electrodes and the drain electrodes; and forming a pixel electrode layer on the passivation layer, wherein the pixel electrode layer is electrically connected to the drain electrodes.

2. A method for manufacturing a thin film transistor array substrate, comprising the following steps:

forming a plurality of gate electrodes on a transparent substrate;

forming a gate insulating layer, a semiconductor layer, an ohmic contact layer, an electrode layer and a first photo-resist layer on the transparent substrate and the gate electrodes in sequence;

patterning the first photo-resist layer to form channels, wherein the channels are formed above the gate electrodes;

etching the ohmic contact layer and the electrode layer, so as to remove a portion of the ohmic contact layer and a portion of the electrode layer, and to form a plurality of source electrodes and a plurality of drain electrodes at both sides of the channels, respectively;

coating a second photo-resist layer on the patterned first photo-resist layer and in the channels;

removing the second photo-resist layer on the patterned first photo-resist layer allowing the second photo-resist layer in the channels to remain therein;

etching the semiconductor layer to remove a portion of the semiconductor layer;

removing the patterned first photo-resist layer and the second photo-resist layer;

forming a passivation layer on the channels, the source electrodes and the drain electrodes; and forming a pixel electrode layer on the passivation layer, wherein the pixel electrode layer is electrically connected to the drain electrodes.

3. The method according to claim 2, wherein, when etching the ohmic contact layer and the electrode layer, a wet etching is performed to remove portions of the ohmic contact layer and the electrode layer which are not sheltered by the patterned first photo-resist layer.

4. The method according to claim 2, wherein, when coating the second photo-resist layer, the second photo-resist layer is coated by spin coating, blade coating or roller coating.

5. The method according to claim 2, wherein, after coating the second photo-resist layer, a thickness of the second photo-resist layer in the channels is larger than another thickness of the second photo-resist layer on the patterned first photo-resist layer.

6. The method according to claim 2, wherein, when removing the second photo-resist layer on the patterned first photo-resist layer, an ashing process is used to remove the second photo-resist layer.

7. The method according to claim 2, wherein, when etching the semiconductor layer, the patterned first photo-resist layer and the second photo-resist layer in the channels are used to act as a mask, and a dry etching is performed to etch the semiconductor layer.

8. The method according to claim 2, wherein, when removing the patterned first photo-resist layer and the second photo-resist layer, the patterned first photo-resist layer and the second photo-resist layer are removed by lifting off.

9. A method for manufacturing a display panel, comprising the following steps:

forming a plurality of gate electrodes on a transparent substrate;

forming a gate insulating layer, a semiconductor layer, an ohmic contact layer, an electrode layer and a first photo-resist layer on the transparent substrate and the gate electrodes in sequence;

patterning the first photo-resist layer to form channels, wherein the channels are formed above the gate electrodes;

etching the ohmic contact layer and the electrode layer, so as to remove a portion of the ohmic contact layer and a portion of the electrode layer, and to form a plurality of source electrodes and a plurality of drain electrodes at both sides of the channels, respectively;

coating a second photo-resist layer on the patterned first photo-resist layer and in the channels;

removing the second photo-resist layer on the patterned first photo-resist layer allowing the second photo-resist layer in the channels to remain therein;

etching the semiconductor layer to remove a portion of the semiconductor layer;

removing the patterned first photo-resist layer and the second photo-resist layer;

forming a passivation layer on the channels, the source electrodes and the drain electrodes;

forming a pixel electrode layer on the passivation layer, wherein the pixel electrode layer is electrically connected to the drain electrodes, so as to achieve a thin film transistor array substrate; and forming a liquid crystal layer between the thin film transistor array substrate and a color filter substrate.

10. The method according to claim 9, wherein, when etching the ohmic contact layer and the electrode layer, a wet etching is performed to remove portions of the ohmic contact layer and the electrode layer which are not sheltered by the patterned first photo-resist layer.

11. The method according to claim 9, wherein, when coating the second photo-resist layer, the second photo-resist layer is coated by spin coating, blade coating or roller coating.

12. The method according to claim 9, wherein, after coating the second photo-resist layer, a thickness of the second photo-resist layer in the channels is larger than another thickness of the second photo-resist layer on the patterned first photo-resist layer.

13. The method according to claim 9, wherein, when removing the second photo-resist layer on the patterned first photo-resist layer, an ashing process is used to remove the second photo-resist layer.

14. The method according to claim 9, wherein, when etching the semiconductor layer, the patterned first photo-resist layer and the second photo-resist layer in the channels are used to act as a mask, and a dry etching is performed to etch the semiconductor layer.

15. The method according to claim 9, wherein, when removing the patterned first photo-resist layer and the second photo-resist layer, the patterned first photo-resist layer and the second photo-resist layer are removed by lifting off.

* * * * *